United States Patent [19]
Bigall et al.

[11] 4,182,211
[45] Jan. 8, 1980

[54] INFORMATION TRANSMISSION SYSTEM

[75] Inventors: Klaus D. Bigall, Vaterstetten; Otto Muehlbauer; Helmut Roesler, both of Munich, all of Fed. Rep. of Germany

[73] Assignee: Siemens Aktiengesellschaft, Berlin & Munich, Fed. Rep. of Germany

[21] Appl. No.: 942,386

[22] Filed: Sep. 14, 1978

[30] Foreign Application Priority Data

Sep. 21, 1977 [DE] Fed. Rep. of Germany ....... 2742512

[51] Int. Cl.² .................. G10H 1/00; H03H 11/00
[52] U.S. Cl. .................................. 84/1.01; 328/242; 84/1.17; 84/1.24
[58] Field of Search .......... 84/1.01, 1.24, 1.17, 84/DIG. 2; 328/103, 152; 307/223 R, 241, 242

[56] References Cited

U.S. PATENT DOCUMENTS

| | | | |
|---|---|---|---|
| 2,874,286 | 2/1959 | Bode | 84/DIG. 2 |
| 3,288,904 | 11/1966 | George | 84/1.01 |
| 3,488,515 | 1/1970 | Hiyoshi | 307/241 |
| 3,509,262 | 4/1970 | Munch, Jr. | 84/DIG. 2 |
| 3,538,804 | 11/1970 | George | 84/1.01 |
| 3,546,355 | 12/1970 | Maynard | 84/1.24 X |
| 3,560,628 | 2/1971 | Plunkett et al. | 84/1.01 X |
| 3,567,838 | 3/1971 | Tennes et al. | 84/1.01 |
| 3,789,718 | 2/1974 | Bunger | 84/1.01 |
| 3,825,667 | 7/1974 | Schrecongost | 84/1.01 |
| 4,064,777 | 12/1977 | Akamatsu | 84/DIG. 2 |

*Primary Examiner*—Ulysses Weldon
*Attorney, Agent, or Firm*—Hill, Van Santen, Steadman, Chiara & Simpson

[57] ABSTRACT

An information transmission system for N information signals for the transmission of either N parallel signals, or of only one information signal from a signal range of M signals with $M \leq N$ at the upper or lower range boundary. N signal transmission gates are provided which can selectively be switched effective, these gates being connected through by means of control signals either for N information signals or for the signals at the upper or lower boundary of a signal range.

10 Claims, 1 Drawing Figure

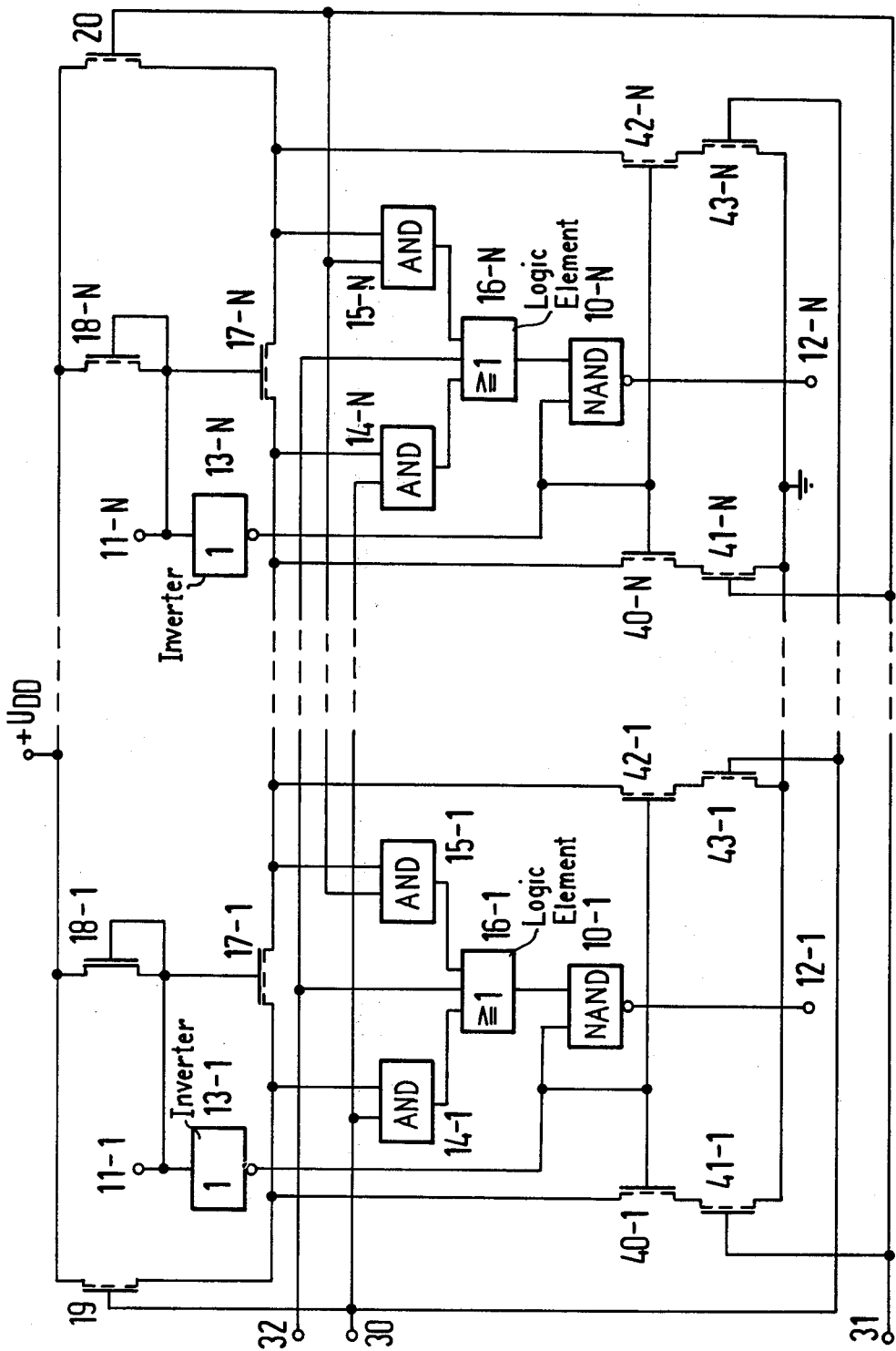

INFORMATION TRANSMISSION SYSTEM

BACKGROUND OF THE INVENTION

The present invention relates to an information transmission system having N signal inputs, N signal outputs and N transmission stages via which the N information signals can be simultaneously transmitted in parallel. Alternatively, from an information signal range of M information signals with $M \leq N$, only the information signal at the upper or at the lower range boundary is transmitted.

For electronic musical instruments such as electronic organs, for example, in which the actuation of a tone or note proceeds by means of keys in keyboards and pedals, it can be desirable to sound only the highest or the lowest tone when several keys are simultaneously pressed. This is particularly the case for pedal tone production since even an experienced player can readily make mistakes in tones in the outer ranges of the pedals. It is therefore expedient to moderate a mistake created by a simultaneous erroneous pedaling of several keys, by providing the possibility in the electronics of the musical instrument of sounding only one tone which can either be the highest or the lowest of several tones simultaneously produced.

Since the possibility of playing the wrong key on the keyboard is less likely for an experienced player, the possibility, on the other hand, should be provided with the production of tones or notes to simultaneously ring out several tones or notes.

Several resolution possibilities are known in electronic organs for the selective blending-out of a single tone from several tones. One possibility, for example, consists of operating with mechanical contacts connected in series. If one of these contacts opens by means of key pressure, other selectively higher or lower contacts receive blocking signals. For these contacts the key signal of the corresponding key is then ignored.

Another possibility is also known in accordance with which each key selectively conveys blocking signals to all higher or lower tones or notes.

Finally, it is also possible in a known manner to assign a flip-flop with additional gates to each key in order to selectively sound the highest or the lowest note of several notes.

All these known resolutions, however, are very expensive particularly for a design in integrated technique and are also susceptible to malfunctions.

SUMMARY OF THE INVENTION

It is an object of the present invention to disclose an inexpensive and malfunction-safe solution for the problem addressed above.

This objective is inventively resolved in an information transmission system having the following characteristics. A signal transmission branch for each transmission stage has a signal transmission gate which is connected to the signal input with one input. An additional input connected to the output of a control circuit supplies a signal that switches the signal transmission gate selectively effective. An output forms the signal output. The control circuit is actuated with at least two control signals, that for the simultaneous parallel transmission of N information signals, the additional input of the signal transmission gates receives a signal which switches them effective. For the transmission of an information signal at the lower boundary of a range of M information signals, only the signal transmission gate for this information signal receives a signal at the lower range boundary which switches this gate effective. For the transmission of an information signal at the upper boundary of a range of M information signals, only the signal transmission gate for this information signal at the upper range boundary receives a signal switching this gate effective.

BRIEF DESCRIPTION OF THE DRAWING

The drawing illustrates a circuit diagram of a sample embodiment of an inventive information transmission system of the invention.

DESCRIPTION OF THE PREFERRED EMBODIMENTS

According to the FIGURE of the drawing, an information transmission system according to the invention contains N equally designed transmission stages one for each tone information signal of a electronic organ, for example, of which only the first and the N-th stage is illustrated in the FIGURE. However, in order to indicate that the inventive information transmission system contains N-2 additional transmission stages, the connections between the first and the N stage are illustrated in dashes.

The information signals such as tone information signals of the organ are fed into tone information signal inputs 11-1 through 11-N, and can be taken out at signal outputs 12-1 through 12-N. Each signal transmission stage contains between its signal input, for example, 11-1, and its signal output, for example, 12-1, a signal transmission branch having a signal transmission gate 10-1 through 10-N in the form of an NAND gate.

As the sample embodiment of the inventive information transmission system is described in conjunction with the production of sound in electronic organs, it is here interesting to note that the input information signals are defined by a logic zero and missing input signals are defined by a logic one at the signal inputs 11-1 through 11-N. The logic one, defining a missing input information signal, is produced at the signal inputs 11-1 through 11-N by means of MOS transistors 18-1 through 18-N connected as impedances, and which are connected to an operating voltage $+U_{DD}$ at one side. Therefore a positive potential, defining the logic one, is present at the signal inputs 11-1 through 11-N. The input information signal defined by a logic zero is produced by applying the corresponding signal input, for example, 11-1 to a reference potential (ground) via a switch, not illustrated, operated by a key.

The signal inputs 11-1 through 11-N are conveyed to an input of the signal transmission gate 10-1 through 10-N in the signal transmission branches via one inverter 13-1 through 13-N, respectively. In order to switch the signal transmission gates 10-1 through 10-N selectively effective, a control circuit is provided connected at its output to an additional input of the signal transmission gates 10-1 through 10-N.

This control circuit for each transmission stage respectively contains one first gate 14-1 through 14-N in the form of an AND gate, which is connected to an input at a first control input 30 and with an additional input in a potential branch, subsequently more precisely explained. Additionally, the control circuit for each transmission stage contains a second gate 15-1 through 15-N in the form of an AND gate, which is connected with an input in a second control input 31 and is connected with an additional input in the previously mentioned potential branch. Finally, the control circuit for each transmission stage respectively contains a logic element 16-1 through 16-N in the form of an OR gate, which couples a third control input 32, common to all transmission stages, and also respectively couples the output of the first and second gate 14-1 through 14-N or 15-1 through 15-N, respectively, to the additional input of respectively one transmission gate 10-1 through 10-N.

The potential branch, earlier mentioned contains a series-connection of MOS transistors 17-1 through 17-N, of which one is connected between the inputs of gates 14-1 through 14-N and 15-1 through 15-N, which are not connected to the first and second control input 30 or 31, respectively. The transistors 17-1 through 17-N in this series connection are actuated via transistors 18-1 through 18-N, connected as impedances to the operating voltage $+U_{DD}$. Additionally, the potential branch contains two additional MOS transistors 19 and 20, also connected to the operating voltage $+U_{DD}$, said MOS transistors being actuated by the first control input 30 or by the second control input 31, respectively.

The operating characteristics of the information transmission system described so far are the following.

When input information signals are missing at the signal inputs 11-1 through 11-N, a logic one, as explained earlier, is present at this input. This logic one is defined by the dropping voltage in the transistors 18-1 through 18-N connected as impedances. It is now first assumed that a logic zero is present at the first and second control input 30 or 31, respectively, and a logic one is present at the third control input 32. With this actuation at the control inputs, the transistors 19 and 20 in the potential branch are blocked. Therefore the controlling of transistors 17-1 through 17-N in the potential branch via transistors 18-1 through 18-N connected as impedances, has no importance for the signal transmission behavior of the system, since a logic zero due to the blocking of transistors 19 and 20, is present at all inputs of gates 14-1 through 14-N and 15-1 through 15-N, not acuated by the control inputs 30 or 31, respectively, and the logic zero is thus also present at the outputs of these gates. However, as the logic elements in the form of OR gates 16-1 through 16-N, receive a logic one via the third control input 32, a logic one is also present at the inputs of the signal transmission gates 10-1 through 10-N which are coupled to the outputs of the OR gates 16-1 through 16-N, so that these signal transmission gates are connected effectively. If an input signal defined by a logic zero is now fed into one or several of the signal inputs 11-1 through 11-N, a logic one is present at the corresponding inputs of the signal transmission gates 10-1 through 10-N on the basis of interposed inverters 13-1 through 13-N. Because a logic one is thus present at the two inputs of the signal transmission gates 10-1 through 10-N, a logic zero results at the signal outputs 12-1 through 12-N, i.e., the input signal at the signal inputs 11-1 through 11-N defined by a logic zero was transmitted to the signal outputs 12-1 through 12-N.

The previously explained functional sequence deals with the case where N information signals can be simultaneously transmitted in parallel from the signal inputs 11-1 through 11-N to the signal outputs 12-1 through 12-N via the information transmission system of the invention.

Now the case will be considered where only the information signal at the lower range boundary is to be transmitted from an information signal range of M-information signals with $M \leq N$ in the information transmission system of the invention. For this case, a logic one is fed into the first control input 30, and a logic zero is fed into the second and third control inputs 31 or 32, respectively. Therefore, all inputs of gates 14-1 through 14-N, connected to the first control input 30, receive a signal switching said inputs effective. The transistor 19 in the potential branch is also connected through on the basis of the logic one at the first control input 30, whereas transistor 20 remains blocked on the basis of the logic zero at the second control input 31. When the transistors 17-1 through 17-N in the potential branch (when input information signals are missing at the signal inputs 11-1 through 11-N) are connected through via transistors 18-1 through 18-N connected as impedances, a logic one is also present at the additional inputs of gates 14-1 through 14-N. Therefore, these gates are connected through and the logic one at their output is connected through to the corresponding input of the signal transmission gate 10-1 through 10-N via the OR gates 16-1 through 16-N. For example, if an input signal, defined by a logic zero, is fed into the signal input 11-1, this input information signal is fed into the corresponding input of the signal transmission gate 10-1 as logic one via inverter 13-1. The actuation is taken away from transistor 17-1 on the basis of the logic zero at the signal input 11-1, so that this transistor is blocked. Therefore, the logic one is taken away from the entire potential branch behind transistor 17-1 to the transmission stage N, so that all gates up to gate 14-N are blocked. Gates 15-1 through 15-N are blocked as they receive a logic zero at one of their inputs from the second control input 31. However, the logic one remains at the input of gate 14-1 so that a logic one is present at the two inputs of the signal transmission gate 10-1, and thus a logic zero is present at the signal output 12-1. The input information signal at the signal input 11-1, defined by a logic zero, is thereby transmitted to the signal output 12-1, whereas additional input information signals to input 11-N cannot be transmitted to gate 14-N due to blockage of the gates. Thus, only the input information signal at the lower boundary of the information signal range is transmitted.

If only the information signal at the upper range boundary is to be transmitted from an information signal range of M information signals with $M \leq N$, a logic one is fed into the second control input 31, and a logic zero is fed into the first and third control input 30 or 32, respectively. The conditions are now reversed, as the transistor 20 is connected through by means of the logic one at the second control input 31, so that when input information signals are missing at the signal inputs 11-1 through 11-N, all gates 15-1 through 15-N are connected through whereas gates 14-1 through 14-N are blocked. If, for example, an input information signal, defined by a logic zero, is fed into input 11-1, transistor 17-N is blocked in the potential branch, so that a logic zero is connected to the entire potential branch behind transistor 17-N, because transistor 19 is also blocked. Then, only the signal transmission gate 10-N is connected effective via gates 15-N and 16-N, so that the input information signal of this transmission stage is transmitted to the signal output 12-N. All other input information signals are not transmitted, as the corresponding gates 15-1 etc. are blocked by means of the logic zero in the potential branch.

It is not absolutely necessary to operate with three separate control signals for the control inputs 30 through 32 for the operating characteristics of the information transmission system of the invention. An inverter can also be provided between control inputs 31 and 32 in order to produce from only one external signal the control signal necessary for the transmission of information signals at range boundaries.

In the aforementioned explanations, an assured switching from logic one to logic zero results from the blocking of specific transistors 17-1 through 17-N in the potential branch in order to block the corresponding gates 14-1 through 14-N or 15-1 through 15-N, respectively. On the basis of unavoidable output capacitances in the potential branch, this switching, however, is not assuredly safeguarded since the output capacitances store a logic one and can thus prevent the switching of gates 14-1 through 14-N or 15-1 through 15-N, respectively.

In order to eliminate such a defective switching behavior, a branch conveyed from the potential branch relating to the reference potential, is respectively provided on one side of each transmission stage. This branch is formed by the series connection of two MOS transistors 40-1 through 40-N and 41-1 through 41-N, or 42-1 through 42-N and 43-1 through 43-N, respectively. Transistors 40-1 through 40-N and 42-1 through 42-N are thereby jointly actuated by the signal inputs 11-1 through 11-N via inverters 13-1 through 13-N. Furthermore, transistors 41-1 through 41-N are actuated by the second control input 31, and transistors 43-1 through 43-N are actuated by the first control input 30.

In order to explain the operating characteristics of these branches we wish to consider the case where only the information signal at the lower range boundary is to be transmitted from an information signal range of M information signals with M≦N. A logic one is then, as explained above, present at the first control input 30, and a logic zero is present at the second and third control inputs 31 or 32, respectively. All transistors 43-1 through 43-N are connected through on the basis of the logic one at the first control input 30, whereas transistors 41-1 through 42-N are blocked due to the logic zero at the second control input 31. If definite input information signals are fed into signal inputs 11-1 through 11-N by means of a logic zero, all transistors 40-1 through 40-N and 42-1 through 42-N are connected through at the outputs of inverters 13-1 through 13-N on the basis of the logic one. Therefore, all branches 42-1, 43-1 through 42-N, 43-N are connected through so that the potential branch behind transistor 17-1 is applied to reference potential (ground) via these branches, i.e., possible line capacitances are discharged via these branches so that a rapid switching from logic one or logic zero is safeguarded in this part of the potential branch.

As can readily be seen, the same conditions hold true for the transmission of an information signal at the upper boundary of an information signal range for the respective other branches, so that a detailed explanation can be spared.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. An information transmission system, comprising:
   (a) N transmission stage means for simultaneously transmitting N information signals in parallel or only an information signal at an upper or at a lower boundary of a range of M information signals with M≦N;
   (b) each transmission stage means comprising a transmission stage connecting to an information signal input and to an information signal output;
   (c) each transmission stage having a signal branch formed of a signal transmission gate having first and second inputs, the first input connecting to the information signal input;
   (d) each transmission stage having a control circuit means having an output connecting to the signal transmission gate second input and for selectively switching the signal transmission gate effective;
   (e) control signal means connected to all of the control circuit means for switching all of the signal transmission gates effective for the simultaneous transmission of the N information signals in parallel, or for switching only a transmission gate effective corresponding to the information signal at the upper or lower range boundary; and
   (f) said control signal means comprising first, second and third control inputs, said control circuit means in each transmission stage comprising first and second gates each having first and second inputs and a logic element having first, second and third inputs, the first control input connecting to the first gate first inputs of all the transmission stages, the second control input connecting to the second gate first inputs of all the transmission stages, and the third control input connecting to the second input of the logic element, an output of the first gate connecting to the first input of the logic element and an output of the second gate connecting to the third input of the logic element in each transmission stage, an output of the logic element connecting to the signal transmission gate second input, and potential branch means connecting to the second inputs of the first and second gates.

2. The system of claim 1 wherein the system is provided as an MOS integrated circuit.

3. The system of claim 1 wherein each signal transmission gate comprises a NAND gate, and the signal transmission gate first input connects to the information signal input through an inverter.

4. The system of claim 1 wherein each first and second gate comprises an AND gate and each logic element comprises an OR gate.

5. The system of claim 1 wherein the potential branch means comprises a controllable switch in each transmission stage.

6. The system of claim 5 wherein the controllable switches and first and second additional controllable switches comprise MOS transistors and the impedance elements comprise MOS transistors.

7. The system of claim 1 wherein said potential branch means connects to an operating potential, and a reference potential branch means connects the second inputs of the first and second gates of each transmission stage to a reference potential.

8. The system of claim 7 wherein the first and second control inputs are connected to actuate the potential branch means and reference potential branch means.

9. The system of claim 7 wherein the reference potential branch means comprises a pair of first and second series connected transistors in each transmission stage, the first transistors being connected to corresponding signal inputs and one of the second transistors being connected to the first control input and the other second transistor being connected to the second control input.

10. An information transmission system for controlling tone information signals in an electronic organ, comprising:
   (a) N transmission stage means for simultaneously transmitting N separate tone information signals, each transmission stage means transmitting one of the tone information signals or transmitting only a tone information signal at an upper or at a lower boundary of a range of M tone information signals with $M \leq N$;
   (b) each transmission stage means comprising a transmission stage connecting to a tone information signal input and to a tone information signal output;
   (c) each transmission stage having a signal branch connected between the signal input and signal output and a control circuit means connected to the signal branch for selectively switching the signal branch to a tone signal pass-through mode;
   (d) control signal means connecting to the control circuit means and comprising first, second and third control inputs;
   (e) said control circuit means in each transmission stage comprising first and second gates each having first and second inputs and a logic element having first, second and third inputs, the first control input connecting to the first gate first inputs of all the transmission stages, the second control input connecting to the second gate first inputs of all the transmission stages, and the third control input connecting to the second input of the logic element, an output of the first gate connecting to the first input of the logic element and an output of the second gate connecting to the third input of the logic element in each transmission stage, an output of the logic element connecting to the signal transmission gate second input, and potential branch means connecting to the second inputs of the first and second gates.

* * * * *